(12) United States Patent
Kanakasabai et al.

(10) Patent No.: US 12,722,786 B2
(45) Date of Patent: Sep. 1, 2026

(54) AERONAUTICAL POWER SYSTEM

(71) Applicant: General Electric Company, Schenectady, NY (US)

(72) Inventors: Viswanathan Kanakasabai, Bengaluru (IN); Sumitha Mohan, Bengaluru (IN); Kum Kang Huh, Niskayuna, NY (US)

(73) Assignee: General Electric Company, Evendale, OH (US)

( * ) Notice: Subject to any disclaimer, the term of this patent is extended or adjusted under 35 U.S.C. 154(b) by 184 days.

(21) Appl. No.: 18/425,728

(22) Filed: Jan. 29, 2024

(65) Prior Publication Data

US 2025/0242930 A1 Jul. 31, 2025

(51) Int. Cl.

*B64D 27/33* (2024.01)
*B64D 27/10* (2006.01)
*H02M 7/00* (2006.01)
*H05K 7/20* (2006.01)

(52) U.S. Cl.

CPC ............ *B64D 27/33* (2024.01); *H02M 7/003* (2013.01); *H05K 7/209* (2013.01); *B64D 27/10* (2013.01)

(58) Field of Classification Search

CPC ....... B64D 27/33; B64D 27/10; H02M 7/003; H05K 7/209; H02J 2310/44; H02J 7/345; H02J 4/00

See application file for complete search history.

(56) References Cited

U.S. PATENT DOCUMENTS 5,939,800 A * 8/1999 Artinian ................. B64D 13/06 307/64
6,909,258 B2 * 6/2005 Milazzotto ............ H02M 5/293 318/807
7,423,391 B2 * 9/2008 Oyobe .................. H02M 7/487 318/558
7,439,634 B2 * 10/2008 Michalko .................. H02J 4/00 307/66
7,440,300 B2 * 10/2008 Konishi .................... H02J 3/38 323/266
7,481,062 B2 * 1/2009 Gaines ................ F16H 37/0826 60/793
7,586,216 B2 * 9/2009 Li ............................ H02P 3/22 307/151
7,593,243 B2 9/2009 Ganev et al.
7,936,086 B2 * 5/2011 Yue ......................... H02J 1/102 307/10.1
8,492,920 B2 7/2013 Huang et al.
9,381,990 B2 * 7/2016 Settemsdal ............... B60L 7/14
10,427,527 B2 10/2019 Siegel et al.
10,443,504 B2 * 10/2019 Dalal ...................... F02C 7/268
10,868,483 B1 12/2020 LeGros et al.
10,934,935 B2 3/2021 Dalal et al.
10,974,836 B2 4/2021 Harwood et al.

(Continued)

FOREIGN PATENT DOCUMENTS

CN 113964811 A * 1/2022 ............. H02K 11/04
EP 2099111 A2 * 9/2009 ................ H02J 1/10
EP 3936365 B1 * 4/2025 ............. B64D 27/31

*Primary Examiner* — Pedro J Cuevas

(74) *Attorney, Agent, or Firm* — Dority & Manning, P.A.

(57) ABSTRACT

An acronautical power system is provided. The system includes a first electric machine having an EM1 channel; a second electric machine having an EM2 channel; a first converter box in electric connection with the EM1 channel and the EM2 channel.

16 Claims, 8 Drawing Sheets

(56) References Cited

U.S. PATENT DOCUMENTS 11,007,955 B2* 5/2021 Klemen .................... H02P 9/04
11,014,513 B2* 5/2021 Klemen .................. F02C 7/275
11,130,456 B2* 9/2021 Klemen ................. H02K 5/203
11,171,594 B2 11/2021 Jung
11,611,256 B2 3/2023 Husband et al.
11,611,287 B2 3/2023 Schmitt et al.
11,634,234 B2 4/2023 Bruce
11,643,940 B2 5/2023 Bruce
11,750,114 B2* 9/2023 Huh .......................... H02P 6/15
307/9.1
12,346,184 B2* 7/2025 Huh ...................... H02M 1/123
12,401,296 B2* 8/2025 Huh ........................ H02P 25/16
2003/0117820 A1* 6/2003 Milazzotto ............ H02M 5/293
363/123
2006/0272313 A1* 12/2006 Eick ........................ F02C 7/275
60/39.63
2007/0047277 A1* 3/2007 Konishi .................... H02J 3/38
363/131
2007/0151258 A1* 7/2007 Gaines ................ F16H 37/0826
60/801
2007/0279815 A1* 12/2007 Li ......................... F03D 7/0248
361/54
2008/0024078 A1* 1/2008 Oyobe .................. H02M 7/797
318/262
2009/0224599 A1* 9/2009 Yue ........................... H02J 1/10
307/9.1
2013/0193755 A1 8/2013 Chang et al.
2014/0333126 A1* 11/2014 Vyas ......................... H02J 4/00
307/9.1
2017/0334377 A1* 11/2017 Klemen .................. B60R 16/03
2017/0335710 A1* 11/2017 Klemen .................... F02C 6/14
2017/0335713 A1* 11/2017 Klemen .................... F02C 7/36
2017/0335795 A1* 11/2017 Klemen ................. H02K 5/203
2021/0044217 A1 2/2021 Bohllander
2021/0339877 A1 11/2021 Salanne et al.
2022/0131435 A1 4/2022 Husband et al.
2022/0176900 A1* 6/2022 Klemen ............... H02K 5/1732
2022/0258867 A1 8/2022 Datta et al.
2022/0371532 A1 11/2022 Huh et al.
2023/0117539 A1 4/2023 Detweiler et al.
2023/0130278 A1 4/2023 Huh et al.
2023/0160344 A1 5/2023 Bruce et al.
2023/0412094 A1* 12/2023 Huh .......................... H02P 6/15
2024/0248522 A1* 7/2024 Huh ...................... H02M 7/797
2024/0308676 A1* 9/2024 Prabhakaran .......... B64D 27/12
2025/0100699 A1* 3/2025 Dai ...................... B64D 27/359
2025/0298453 A1* 9/2025 Huh ....................... B64D 41/00
2025/0357870 A1* 11/2025 Huh ....................... B64D 27/12

* cited by examiner

AERONAUTICAL POWER SYSTEM

FIELD

The present disclosure relates to an aeronautical power system including two electric machines which may be incorporated into an aeronautical gas turbine engine.

BACKGROUND

A conventional commercial aircraft generally includes a fuselage, a pair of wings, and a propulsion system that provides thrust. The propulsion system typically includes at least two aircraft engines, such as turbofan jet engines. Each turbofan jet engine is typically mounted to a respective one of the wings of the aircraft, such as in a suspended position beneath the wing separated from the wing and fuselage.

Hybrid-electric propulsion systems are being developed to improve an efficiency of conventional commercial aircraft. Some hybrid electric propulsion systems include one or more electric machines each being mechanically coupled with a rotating component of one of the aircraft engines. The electric machines can each have an associated power converter electrically connected thereto. The inventors of the present disclosure have developed various systems and methods to improve hybrid electric propulsion systems, and more generally, power systems.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Figure 1:
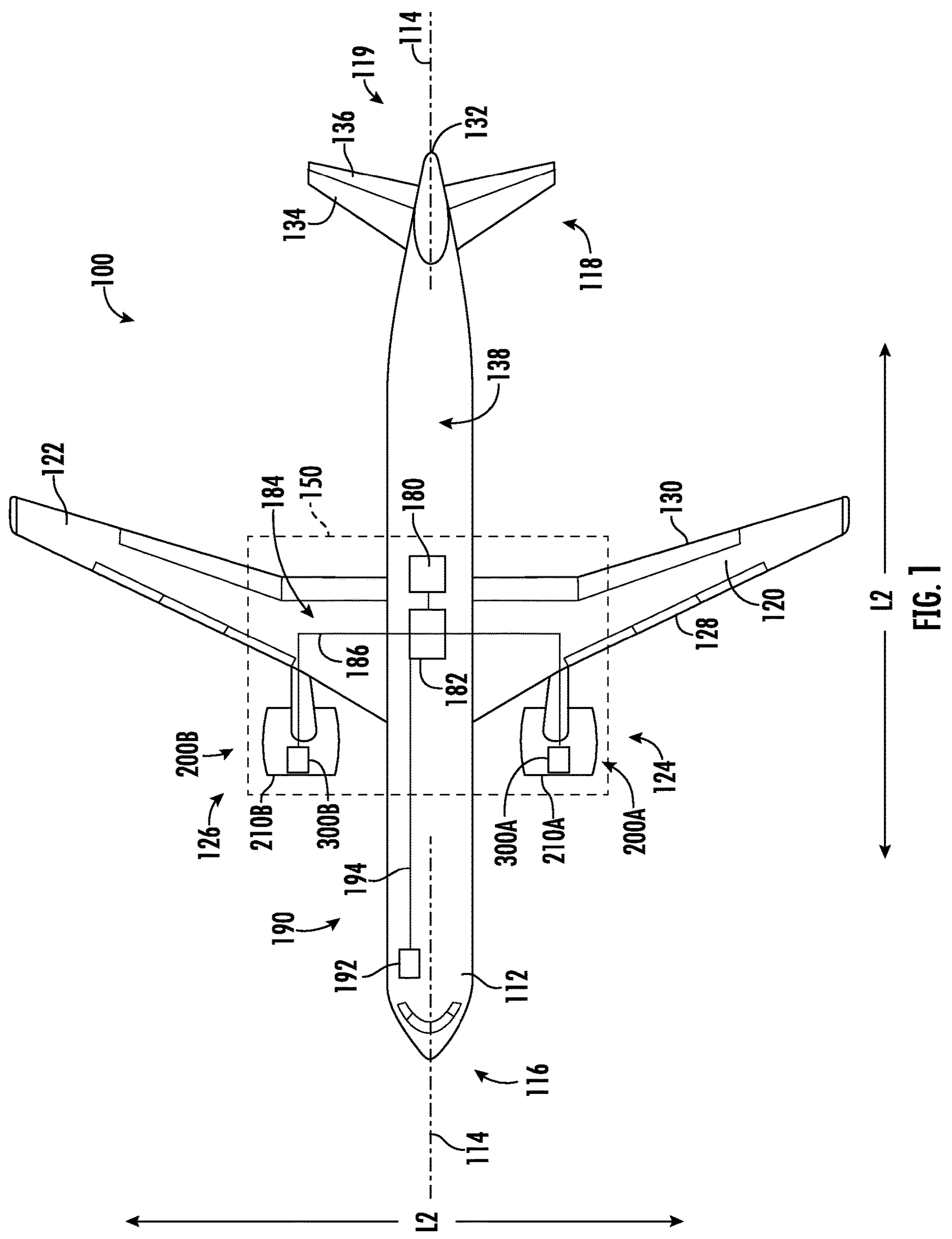
FIG. 1 provides a schematic top view of an aircraft having a hybrid-electric propulsion system according to various exemplary embodiments of the present disclosure.

Reference will now be made in detail to present embodiments of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

The word “exemplary” is used herein to mean “serving as an example, instance, or illustration.” Any implementation described herein as “exemplary” is not necessarily to be construed as preferred or advantageous over other implementations. Additionally, unless specifically identified otherwise, all embodiments described herein should be considered exemplary.

The singular forms “a”, “an”, and “the” include plural references unless the context clearly dictates otherwise.

The term “at least one of” in the context of, e.g., “at least one of A, B, and C” refers to only A, only B, only C, or any combination of A, B, and C.

As used herein, the terms “first”, “second”, and “third” may be used interchangeably to distinguish one component from another and are not intended to signify location or importance of the individual components.

The terms “forward” and “aft” refer to relative positions within a gas turbine engine or vehicle, and refer to the normal operational attitude of the gas turbine engine or vehicle. For example, with regard to a gas turbine engine, forward refers to a position closer to an engine inlet and aft refers to a position closer to an engine nozzle or exhaust.

The terms “upstream” and “downstream” refer to the relative direction with respect to a flow in a pathway. For example, with respect to a fluid flow, “upstream” refers to the direction from which the fluid flows, and “downstream” refers to the direction to which the fluid flows. However, the terms “upstream” and “downstream” as used herein may also refer to a flow of electricity.

The integration of electric machines with varied power ratings (e.g., a low pressure (LP) electric machine rotatable with an LP system of an engine rated at a higher power than a high pressure (HP) electric machine rotatable with an HP system of the engine) within a restricted space of a gas turbine engine may provide several challenges. Firstly, with prior configurations where the LP and HP electric machines include two or more channels, each channel of the LP and HP electric machine would be coupled to a dedicated alternating current/direct current (AC/DC) converter box, which may take up significant room in the engine. Secondly, by having separate power ratings, thermal management becomes more complex as there are more tailored thermal needs for each of the various components associated with LP and HP electric machines. Thirdly, the integration demands additional components like capacitor banks and electromagnetic interference (EM1) filters for each channel of the LP and HP channels, further compounding the spatial challenges.

In order to address the above issues, the present disclosure provides for a unique co-housing arrangement wherein one AC/DC converter from the high-powered LP electric machine's first channel is co-housed with an AC/DC converter from a first channel of the HP machine. Similarly, another set of AC/DC converters for the second channels of both machines are separately co-housed. This arrangement saves space within the volume of the engine in which the system is mounted.

In addition, to further save space within the volume of the engine in which the system is mounted, the first set of AC/DC converters (from the first channels of both the LP and HP electric machines) utilize a shared capacitor bank and EMI filter. Likewise, the second set of AC/DC converters (from the second channels of both machines) are equipped with a second common capacitor bank and EMI filter. Such a configuration further allows for a single DC power link to be provided from the first channels of the LP and HP electric machines to a power distribution and monitoring unit, and similarly for a single DC power link to be provided from the second channels of the LP and HP electric machines to the power distribution and monitoring unit.

Further, despite the differences in power ratings of the LP and HP electric machines, by co-housing (and co-locating) the AC/DC converters for first channels of both the LP and HP electric machines and co-housing (and co-locating) the AC/DC converters for second channels of both the LP and HP electric machines, the thermal management needs for the two locations is relatively equal, allowing for redundancies in the thermal management systems for the locations.

Referring now to the drawings, wherein identical numerals indicate the same elements throughout the figures, FIG. 1 provides a schematic top view of an exemplary aircraft 100 as may incorporate one or more inventive aspects of the present disclosure. As shown in FIG. 1, for reference, the aircraft 100 defines a longitudinal direction L1 and a lateral direction L2. The lateral direction L2 is perpendicular to the longitudinal direction L1. The aircraft 100 also defines a longitudinal centerline 114 that extends therethrough along the longitudinal direction L1. The aircraft 100 extends between a forward end 116 and an aft end 118, e.g., along the longitudinal direction L1.

As depicted, the aircraft 100 includes a fuselage 112 that extends longitudinally from the forward end 116 of the aircraft 100 to the aft end 118 of the aircraft 100. The aircraft 100 also includes an empennage 119 at the aft end 118 of the aircraft 100. In addition, the aircraft 100 includes a wing assembly including a first, port side wing 120 and a second, starboard side wing 122. The first and second wings 120, 122 each extend laterally outward with respect to the longitudinal centerline 114. The first wing 120 and a portion of the fuselage 112 together define a first side 124 of the aircraft 100 and the second wing 122 and another portion of the fuselage 112 together define a second side 126 of the aircraft 100. For the embodiment depicted, the first side 124 of the aircraft 100 is configured as the port side of the aircraft 100 and the second side 126 of the aircraft 100 is configured as the starboard side of the aircraft 100.

The aircraft 100 includes various control surfaces. For this embodiment, each wing 120, 122 includes one or more leading edge flaps 128 and one or more trailing edge flaps 130. The aircraft 100 further includes, or more specifically, the empennage 119 of the aircraft 100 includes a vertical stabilizer 132 having a rudder flap (not shown) for yaw control and a pair of horizontal stabilizers 134 each having an elevator flap 136 for pitch control. The fuselage 112 additionally includes an outer surface or skin 138. It should be appreciated that in other exemplary embodiments of the present disclosure, the aircraft 100 may additionally or alternatively include any other suitable configuration. For example, in other embodiments, the aircraft 100 may include any other control surface configuration.

The exemplary aircraft 100 of FIG. 1 also includes a hybrid-electric propulsion system 150. For this embodiment, the hybrid-electric propulsion system 150 has a first propulsor 200A and a second propulsor 200B both operable to produce thrust. The first propulsor 200A is mounted to the first wing 120 and the second propulsor 200B is mounted to the second wing 122. Moreover, for the embodiment depicted, the first propulsor 200A and second propulsor 200B are each configured in an underwing-mounted configuration. However, in other example embodiments, one or both of the first and second propulsors 200A, 200B may be mounted at any other suitable location in other exemplary embodiments.

The first propulsor 200A includes a gas turbine engine 210A and one or more electric machines, such as electric machine 300A mechanically coupled with the gas turbine engine 210A. The electric machine 300A can be an electric generator, an electric motor, or a combination generator/motor. For this example embodiment, the electric machine 300A is a combination generator/motor. In this manner, when operating as an electric generator, the electric machine 300A can generate electrical power when driven by the gas turbine engine 210A. When operating as an electric motor, the electric machine 300A can drive or motor the gas turbine engine 210A.

Likewise, the second propulsor 200B includes a gas turbine engine 210B and one or more electric machines, such as electric machine 300B mechanically coupled with the gas turbine engine 210B. The electric machine 300B can be an electric generator, an electric motor, or a combination generator/motor. For this example embodiment, the electric machine 300B is a combination generator/motor. In this manner, when operating as an electric generator, the electric machine 300B can generate electrical power when driven by the gas turbine engine 210B. When operating as an electric motor, the electric machine 300B can drive or motor a spool of the gas turbine engine 210B. Electric machine 300B can be configured and can operate in a similar manner as electric machine 300A described herein.

The hybrid-electric propulsion system 150 further includes an electric energy storage unit 180 electrically connectable to the electric machines 300A, 300B, and in some embodiments, other electrical loads. In some exemplary embodiments, the electric energy storage unit 180 may include one or more batteries. Additionally, or alternatively, the electric energy storage units 180 may include one or more supercapacitor arrays, one or more ultracapacitor arrays, or both. For the hybrid-electric propulsion system 150 described herein, the electric energy storage unit 180 is configured to store a relatively large amount of electrical power. For example, in certain exemplary embodiments, the electric energy storage unit 180 may be configured to store at least about fifty kilowatt hours of electrical power, such as about seventy-five kilowatt hours of electrical power, and up to about one thousand kilowatt hours of electrical power.

The hybrid-electric propulsion system 150 also includes a power management system having a controller 182 and a power bus 184. The electric machines 300A, 300B, the electric energy storage unit 180, and the controller 182 are each electrically connectable to one another through one or more electric lines 186 of the power bus 184.

The controller 182 is configured to control the power electronics to distribute electrical power between the various components of the hybrid-electric propulsion system 150. For example, the controller 182 may control the power electronics of the power bus 184 to provide electrical power to, or draw electrical power from, the various components, such as the electric machines 300A, 300B, to operate the hybrid-electric propulsion system 150 between various operating modes and perform various functions. Such is depicted schematically as the electric lines 186 of the power bus 184 extend through the controller 182.

The controller 182 can form a part of a computing system 190 of the aircraft 100. The computing system 190 of the aircraft 100 can include one or more processors and one or more memory devices embodied in one or more computing devices. For instance, as depicted in FIG. 1, the computing system 190 includes controller 182 as well as other computing devices, such as computing device 192. The computing system 190 can include other computing devices as well, such as engine controllers (not shown). The computing devices of the computing system 190 can be communicatively coupled with one another via a communication network. For instance, computing device 192 is located in the cockpit of the aircraft 100 and is communicatively coupled with the controller 182 of the hybrid-electric propulsion system 150 via a communication link 194 of the communication network. The communication link 194 can include one or more wired or wireless communication links.

For this embodiment, the computing device 192 is configured to receive and process inputs, e.g., from a pilot or other crew members, and/or other information. In this manner, as one example, the one or more processors of the computing device 192 can receive an input indicating a command to change a thrust output of the first and/or second propulsors 200A, 200B and can cause, in response to the input, the controller 182 to control the electrical power drawn from or delivered to one or both of the electric machines 300A, 300B to ultimately change the thrust output of one or both of the propulsors 200A, 200B.

The controller 182 and other computing devices of the computing system 190 of the aircraft 100 may be configured in substantially the same manner as the exemplary computing devices of the computing system 600 described below with reference to FIG. 9.

It will be appreciated that the electric machines 300A, 300*b*, electric energy storage unit 180, and power management system (having the controller 182 and the power bus 184) may more specifically be configured as part of an aeronautical power system integrated with the gas turbine engines of the hybrid-electric propulsion system 150.

Figure 2:
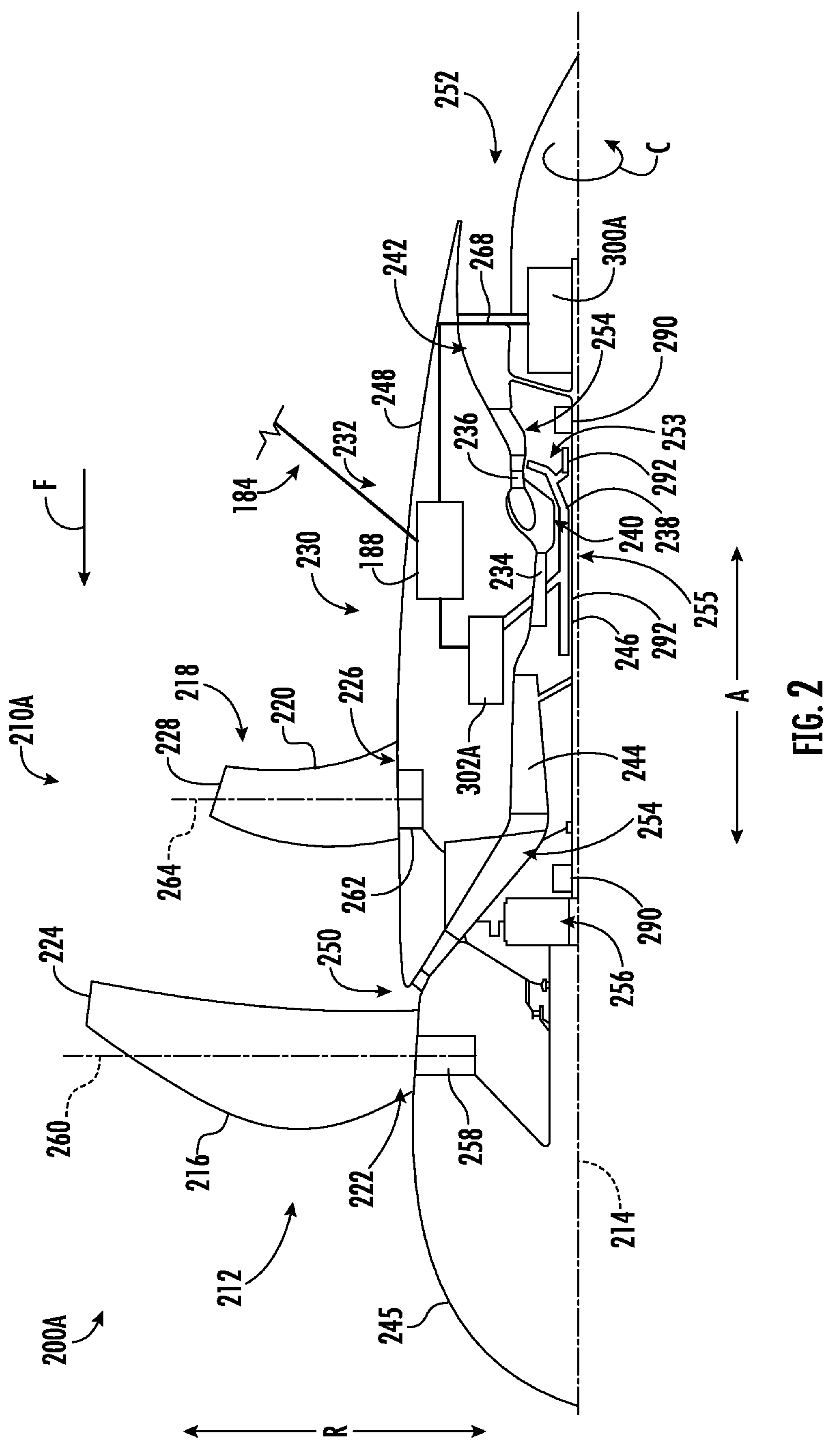
FIG. 2 provides a schematic cross-sectional view of one of the hybrid-electric propulsors of the aircraft of FIG. 1.

FIG. 2 provides a schematic view of the first propulsor 200A of the hybrid-electric propulsion system 150 of the aircraft 100 of FIG. 1. Although the first propulsor 200A is shown, it will be appreciated that the second propulsor 200B can be configured in the same or similar manner as the first propulsor 200A depicted in FIG. 2. The exemplary gas turbine engine of FIG. 2 is configured as a single unducted rotor engine 210A defining an axial direction A, a radial direction R, and a circumferential direction C. The engine 210A also defines a central longitudinal axis 214.

As shown in FIG. 2, the engine 210A takes the form of an open rotor propulsion system and has a rotor assembly 212 that includes an array of airfoils arranged around the central longitudinal axis 214 of engine 210A. More particularly, the rotor assembly 212 includes an array of rotor blades 216 arranged around the central longitudinal axis 214 of the engine 210A. Moreover, as will be explained in more detail below, the engine 210A also includes a non-rotating vane assembly 218 positioned aft of the rotor assembly 212 (i.e., non-rotating with respect to the central axis 214). The non-rotating vane assembly 218 includes an array of airfoils also disposed around central axis 214. More specifically, the vane assembly 218 includes an array of vanes 220 disposed around central longitudinal axis 214.

The rotor blades 216 are arranged in typically equally-spaced relation around the central longitudinal axis 214, and each blade has a root 222 and a tip 224 and a span defined therebetween. Similarly, the vanes 220 are also arranged in typically equally-spaced relation around the central longitudinal axis 214, and each has a root 226 and a tip 228 and a span defined therebetween. The rotor assembly 212 further includes a hub 245 located forward of the plurality of rotor blades 216.

Additionally, the engine 210A includes a turbomachine 230 having a core 232 (or high pressure/high speed system) and a low pressure/low speed system. It will be appreciated that as used herein, the terms "speed" and "pressure" are used with respect to the high pressure/high speed system and low pressure/low speed system interchangeably. Further, it will be appreciated that the terms "high" and "low" are used in this same context to distinguish the two systems, and are not meant to imply any absolute speed and/or pressure values.

The core 232 generally includes a high speed compressor 234, a high speed turbine 236, and a high speed shaft 238 extending therebetween and connecting the high speed compressor 234 and high speed turbine 236. The high speed compressor 234, the high speed turbine 236, and the high speed shaft 238 may collectively be referred to as a high speed spool 253 of the engine. Further, a combustion section 240 is located between the high speed compressor 234 and high speed turbine 236. The combustion section 240 may include one or more configurations for receiving a mixture of fuel and air, and providing a flow of combustion gasses through the high speed turbine 236 for driving the high speed spool 253.

The low speed system includes a low speed turbine 242, a low speed compressor 244 or booster, and a low speed shaft 246 extending between and connecting the low speed compressor 244 and low speed turbine 242. The low speed compressor 244, the low speed turbine 242, and the low speed shaft 246 may collectively be referred to as a low speed spool 255 of the engine.

Although the engine 210A is depicted with the low speed compressor 244 positioned forward of the high speed compressor 234, in certain embodiments, the compressors 234, 244 may be in an interdigitated arrangement. Additionally, or alternatively, although the engine 210A is depicted with the high speed turbine 236 positioned forward of the low speed turbine 242, in certain embodiments, the turbines 236, 242 may similarly be in an interdigitated arrangement.

In order to support the rotating components of the engine 210A, the engine 210A includes a plurality of bearings coupling the rotating components to various structural components. Specifically, as depicted in FIG. 2, bearings 290 support and facilitate rotation of the low speed shaft 246. Further, bearings 292 support and facilitate rotation of the high speed shaft 238. Although the bearings 290, 292 are illustrated as being located generally at forward and aft ends of their associated shafts 246, 238, the bearings 290, 292 may be located at any desired location along their associated shafts. Moreover, in some embodiments, one or more additional bearings other than the bearings 290 shown in FIG. 2 can be used to support the low speed shaft 246. For instance, in some embodiments, an additional bearing can be positioned at a central or mid-span region of the low speed shaft 246 provides support thereto. Similarly, one or more additional bearings other than the bearings 290 shown in FIG. 2 can be used to support the high-speed shaft 238. The bearings 290, 292 can be any suitable type of bearings, such as air bearings, oil-lubricated bearings, etc.

Referring still to FIG. 2, the turbomachine 230 is generally encased in a cowl 248. Moreover, it will be appreciated that the cowl 248 defines at least in part an inlet 250 and an exhaust 252, and includes a turbomachinery flowpath 254 extending between the inlet 250 and the exhaust 252. The inlet 250 is, for the embodiment shown, an annular or axisymmetric 360 degree inlet 250 located between the rotor assembly 212 and the fixed or stationary vane assembly 218 along the axial direction A, and provides a path for incoming atmospheric air to enter the turbomachinery flowpath 254 (and compressors 244, 234, combustion section 240, and turbines 236, 242) inwardly of the guide vanes 220 along the radial direction R. Such a location may be advantageous for a variety of reasons, including management of icing performance as well as protecting the inlet 250 from various objects and materials as may be encountered in operation. In other embodiments, however, the inlet 250 may be positioned at any other suitable location, e.g., aft of the vane assembly 218, arranged in a non-axisymmetric manner, etc.

As depicted, the rotor assembly 212 is driven by the turbomachine 230, and more specifically, the low speed spool 255 of the turbomachine 230. More specifically, for this embodiment, the engine 210A includes a power gearbox 256. The rotor assembly 212 is driven by the low speed spool 255 of the turbomachine 230 across the power gearbox 256. In such a manner, the rotating rotor blades 216 of the rotor assembly 212 may rotate around the central longitudinal axis 214 and generate thrust to propel engine 210A, and hence, the aircraft 100 (FIG. 1) to which it is associated, in a forward direction F. The power gearbox 256 can include a gearset for decreasing a rotational speed of the low speed spool 255 relative to the low speed turbine 242 such that the rotor assembly 212 may rotate at a slower rotational speed than the low speed spool 255.

As briefly noted above, the engine 210A includes vane assembly 218. The vane assembly 218 extends from the cowl 248 and is positioned aft of the rotor assembly 212. The vanes 220 of the vane assembly 218 may be mounted to a stationary frame or other mounting structure and do not rotate relative to the central longitudinal axis 214. For reference purposes, FIG. 2 depicts the forward direction with arrow F, which in turn defines the forward and aft portions of the engine 210A. As shown in FIG. 2, the rotor assembly 212 is located forward of the turbomachine 230 in a "puller" configuration and the exhaust 252 is located aft of the guide vanes 220. The vanes 220 of the vane assembly 218 are aerodynamically contoured to straighten out an airflow (e.g., reducing a swirl in the airflow) from the rotor assembly 212 to increase an efficiency of the engine 210A. For example, the vanes 220 may be sized, shaped, and configured to impart a counteracting swirl to the airflow from the rotor blades 216 so that in a downstream direction aft of both rows of airfoils (e.g., blades 216, vanes 220) the airflow has a greatly reduced degree of swirl, which may translate to an increased level of induced efficiency.

In some embodiments, it may be desirable that the rotor blades 216, the vanes 220, or both, incorporate a pitch change mechanism such that the airfoils (e.g., blades 216, vanes 220, etc.) can be rotated with respect to an axis of pitch rotation either independently or in conjunction with one another. Such pitch change can be utilized to vary thrust and/or swirl effects under various operating conditions, including to adjust a magnitude or direction of thrust produced at the rotor blades 216, or to provide a thrust reversing feature which may be useful in certain operating conditions, such as upon landing an aircraft, or to desirably adjust acoustic noise produced at least in part by the rotor blades 216, the vanes 220, or aerodynamic interactions from the rotor blades 216 relative to the vanes 220. More specifically, for the embodiment of FIG. 2, the rotor assembly 212 is depicted with a pitch change mechanism 258 for rotating the rotor blades 216 about their respective pitch axes 260, and the vane assembly 218 is depicted with a pitch change mechanism 262 for rotating the vanes 220 about their respective pitch axes 264.

The exemplary single rotor unducted engine 210A depicted in FIG. 2 is provided by way of example only. Accordingly, it will be appreciated that the engine 210A may have other suitable configurations. For example, in other example embodiments, the engine 210A can have other suitable numbers of shafts or spools, turbines, compressors, etc.; fixed-pitch blades or vanes 216, 220, or both; a direct-drive configuration (i.e., may not include the gearbox 256); etc. For example, in other exemplary embodiments, the engine 210A may be a three-spool engine, having an intermediate speed compressor and/or turbine. In such a configuration, it will be appreciated that the terms "high" and "low," as used herein with respect to the speed and/or pressure of a turbine, compressor, or spool are terms of convenience to differentiate between the components, but do not require any specific relative speeds and/or pressures, and are not exclusive of additional compressors, turbines, and/or spools or shafts.

Additionally or alternatively, in other exemplary embodiments, any other suitable gas turbine engine may be provided. For example, in other exemplary embodiments, the gas turbine engine may be a turboshaft engine, a turboprop engine, turbojet engine, etc. Moreover, for example, although the engine is depicted as a single unducted rotor engine, in other embodiments, the engine may include a multi-stage open rotor configuration, and aspects of the disclosure described hereinbelow may be incorporated therein.

Further, in other exemplary embodiments, the engine 210A may be configured as a ducted turbofan engine. For example, with such a configuration, the engine 210A may include an outer nacelle surrounding at least in part the rotor assembly 212, and the vanes 220 of the vane assembly 218 may extend between and connect the nacelle with the cowl 248.

Referring still to FIG. 2, as noted, the first propulsor 200A includes electric machine 300A operably coupled with a rotating component thereof. In this regard, the first propulsor 200A is an aeronautical hybrid-electric propulsion machine. Particularly, as shown in FIG. 2, the electric machine 300A is mechanically coupled with the low speed spool 255 of the gas turbine engine 210A, and more particularly, the low speed shaft 246 of the low speed spool 255. As depicted, the electric machine 300A is embedded within the core of the gas turbine engine 210A. Specifically, the electric machine 300A is positioned inward of the turbomachinery flowpath 254 along the radial direction R. Moreover, for this embodiment, the electric machine 300A is positioned generally at the aft end of the gas turbine engine 210A and is at least partially overlapping with or aft of the low pressure turbine 242 along the axial direction A.

However, in other exemplary embodiments, the electric machine 300A may be positioned at other suitable locations within the gas turbine engine 210A. For instance, in some embodiments, the electric machine 300A can be coupled with the low speed spool 255 in other suitable locations. For instance, in some embodiments, the electric machine 300A can be positioned forward of the low pressure compressor 244 along the axial direction A and inward of the turbomachinery flowpath 254 along the radial direction R. Further, as shown in FIG. 2, the electric machine 300A mechanically coupled with the low speed shaft 246 is electrically coupled with the power bus 184.

In addition or alternatively to the gas turbine engine 210A having electric machine 300A coupled to the low speed spool 255, in the embodiment depicted, the gas turbine engine 210A further includes an electric machine 302A mechanically coupled with the high speed spool 253 of the gas turbine engine 210A, and more particularly, the high speed shaft 238 of the high speed spool 253. As depicted in FIG. 2, the electric machine 302A is mechanically coupled with the high speed shaft 238 through a mechanical linkage. The electric machine 302A is positioned outward of the turbomachinery flowpath 254 along the radial direction R and is positioned forward of the combustion section 140 along the axial direction A.

However, in other exemplary embodiments, the electric machine 302A may be positioned at other suitable locations within the gas turbine engine 210A (e.g., inward of the turbomachinery flowpath 254 along the radial direction R).

Like the electric machine 300A mechanically coupled with the low speed spool 255, the electric machine 302A mechanically coupled with the high speed spool 253 can be an electric motor operable to drive or motor the high speed shaft 238, e.g., during a starting operation of the gas turbine engine 210A. In other embodiments, the electric machine 302A can be an electric generator operable to convert mechanical energy into electrical energy. In this way, electrical power generated by the electric machine 302A can be directed to various engine and/or aircraft systems. In some embodiments, the electric machine 302A can be a motor/generator with dual functionality.

Further, as shown in FIG. 2, the electric machine 302A mechanically coupled with the high speed shaft 238 is also electrically coupled with the power bus 184. More specifically, the aeronautical power system includes a power electronics assembly located between the electric machines 300A, 302A and the power bus 184. The power electronics assembly may include one or more of the components discussed below with reference to FIGS. 3 through 8.

Figure 3:
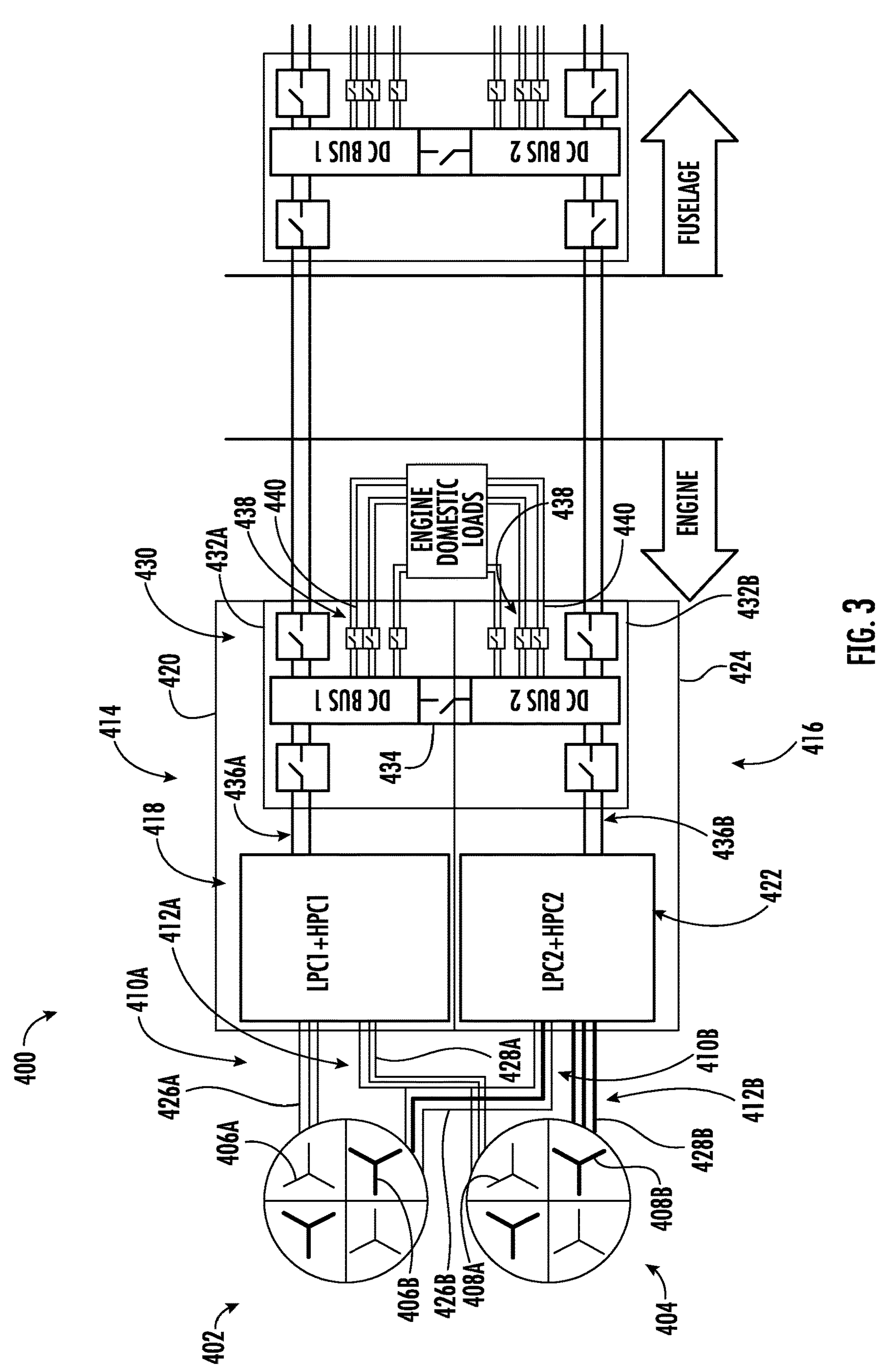
FIG. 3 is a simplified, schematic view is provided of an aeronautical power system in accordance with an exemplary aspect of the present disclosure.

Referring now to FIG. 3, a simplified, schematic view is provided of an aeronautical power system 400 in accordance with an exemplary aspect of the present disclosure. The exemplary aeronautical power system 400 of FIG. 3 may be incorporated into one or more of the engines 210A, 210B and/or aircraft 100 described herein, or in any other suitable engine and/or aircraft.

The exemplary aeronautical power system 400 generally includes a first electric machine 402 and a second electric machine 404. The first electric machine 402 may be rotatable with a first rotating component of an engine when the aeronautical power system 400 is integrated with the engine, and the second electric machine 404 may be rotatable with a second rotating component of the engine when the aeronautical power system 400 is integrated with the engine. For example, in certain exemplary embodiments, the first electric machine 402 may be a low pressure electric machine rotatable with a low pressure spool of the engine (e.g., low speed spool 255 of engine 210A in FIG. 2) and the second electric machine 404 may be a high pressure electric machine rotatable with a high pressure spool of the engine (e.g., high speed spool 253 of engine 210A in FIG. 2).

In the embodiment depicted in FIG. 3, the first electric machine 402 and the second electric machine 404 are each configured as a three-phase electric machine including at least two sets of windings—EM1 first winding 406A and EM1 second winding 406B at the first electric machine 402 and EM2 first winding 408A and EM2 second winding 408B at the second electric machine 402. The electrical connection to each set of winding is referred to herein as a "channel" (discussed in more detail below). In at least certain embodiments of the present disclosure, the first electric machine 402 may be configured such that each of the sets of windings (and each corresponding channel) is configured to operate at the same voltage and frequency, and similarly, the second electric machine 404 may be configured such that each of the sets of windings (and each corresponding channel) is configured to operate at the same voltage and frequency.

In such a manner, it will be appreciated that the first electric machine 402 includes a first channel, referred to herein as EM1 first channel 410A, and a second channel, referred to herein as EM1 second channel 410B. Similarly, the second electric machine 404 includes a first channel, referred to herein as EM2 first channel 412A, and a second channel, referred to herein as EM2 second channel 412B. The EM1 first channel 410A may be electrically connected to a first set of windings of the first electric machine 402 (EM1 first winding 406A), the EM1 second channel 410B may be electrically connected to a second set of windings of the first electric machine 402 (EM1 second winding 406B), the EM2 first channel 412A may be electrically connected to a first set of windings of the second electric machine 404 (EM2 first winding 408A), and the EM2 second channel 412B may be electrically connected to a second set of windings of the second electric machine 404 (EM2 second winding 408B).

It will be appreciated that the exemplary first electric machine 402 and the exemplary second electric machine 404 more specifically each include four sets of windings. In some cases, a pair of windings of a machine may be connected in a series or in a parallel configuration to form a single channel e.g., channel 410A or 410B. In some case, in addition to the two channels formed by two sets of windings, two additional channels (not shown) may be formed by the other two windings. The other sets of windings of the first electric machine 402 and the second electric machine 404 may be in electrical connection with a power electronics system similar to the power electronics system discussed hereinbelow. Further, it will be appreciated that in other exemplary embodiments, the first electric machine 402 and the second electric machine 404 may instead be two channel electric machines (i.e., only having two sets of windings), or may include any other suitable number of channels.

Referring still to FIG. 3, the exemplary aeronautical power system 400 depicted further includes a first converter box 414 and a second converter box 416. The first converter box 414 generally includes a first converter assembly 418 and an outer housing or casing 420 enclosing the first converter assembly 418, and the second converter box 416 generally includes a second converter assembly 422 and an outer housing or casing 424 enclosing the second converter assembly 422. It will be appreciated that as used herein, the term "housed" or "enclosed", with reference to one of the housings 420, 424, refers to a component being positioned within an interior of the respective housings 420, 424. The housings 420, 424 may be formed of single-piece, dedicated wall structures, or may be formed of a plurality of dedicated and/or shared wall structures, joined in any suitable manner.

The first converter box 414, and more specifically, the first converter assembly 418 of the first converter box 414, is in electric connection with the EM1 first channel 410A of the first electric machine 402 through EM1 first channel AC power cables 426A and with the EM2 first channel 412A of the second electric machine 404 through EM2 first channel AC power cables 428A. Similarly, the second converter box 416, and more specifically the second converter assembly 422 of the second converter box 416, is in electric connection with the EM1 second channel 410B of the first electric machine 402 through EM1 second channel AC power cables 426B and with the EM2 second channel 412B of the second electric machine 404 through EM2 second channel AC power cables 428B. As will be explained in more detail below, such a configuration may provide desired redundancies for the aeronautical power system 400 disclosed, as well as desired thermal management benefits.

The aeronautical power system 400 depicted further includes a power controller, and more specifically one or more power distribution and monitoring units 430 (referred to herein as "PDMU"), in electric connection with the first converter assembly 418 of the first converter box 414 and the second converter assembly 422 of the second converter box 416, as well as with one or more electric power loads, electric power sources, or both (e.g., of the engine and/or of the aircraft). In such a manner, the PDMU 430 may receive electric power from the first converter assembly 418 and the second converter assembly 422 (and more specifically from the first electric machine 402 and the second electric machine 404), and may distribute the electric power to one or more electric power loads of the engine and the aircraft, e.g., in response to one or more commands or other data inputs. Of course, in other embodiments, the directional flow of electric power may be reversed.

It will be appreciated that the PDMU 430 may include a computing device(s) configured in substantially the same manner as the exemplary computing devices of the computing system 600 described below with reference to FIG. 9. In such a manner, the PDMU 430 may be configured to receive one or more data inputs, and may make control decisions in response to the one or more data inputs.

In the embodiment depicted, the PDMU 430 includes a first section 432A and a second section 432B. The first and second sections 432A, 432B of the PDMU 430 are in electric connection with one another through a PDMU switch 434 in the embodiment depicted.

Further, in the embodiment depicted, the first section 432A of the PDMU 430 is housed within the first converter box 414 and is in electric connection with the first converter assembly 418 of the first converter box 414 through a first single DC power link 436A. Similarly, the second section 432B of the PDMU 430 is housed within the second converter box 416 and is in electric connection with the second converter assembly 422 of the second converter box 416 through a second single DC power link 436B.

As noted above, the PDMU may provide electric power to one or more loads of the engine and/or the aircraft. In particular, the first section 432A of the PDMU 430 includes plurality of breakers and/or switches 438 and further includes a plurality of electric power distribution lines 440. Each electric power distribution line 440 of the first section 432A of the PDMU 430 extends from a respective one of the plurality of breakers and/or switches 438. Each of the plurality of breakers and/or switches 438 of the first section 432A of the PDMU 430 is housed within the first converter box 414. Similarly, the second section 432B of the PDMU 430 includes a plurality of breakers and/or switches 438 and further includes a plurality of electric power distribution lines 440. Each electric power distribution line 440 of the second section 432B of the PDMU 430 extends from a respective one of the plurality of breakers and/or switches 438. Each of the plurality of breakers and/or switches 438 of the second section 432B of the PDMU 430 is housed within the second converter box 416.

Figure 4:
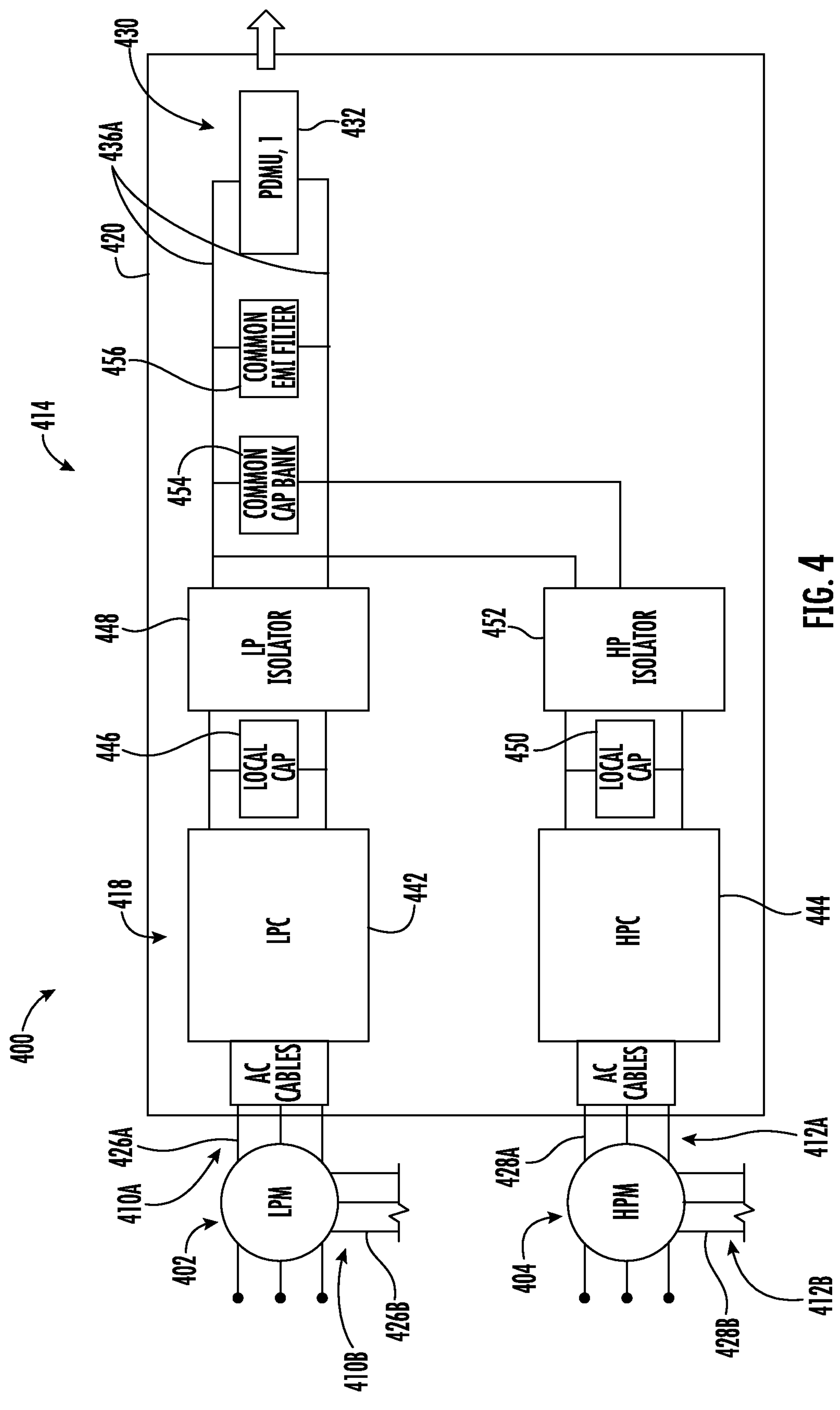
FIG. 4 is a simplified, schematic view of a first converter box of an aeronautical power system in accordance with an exemplary aspect of the present disclosure.
Figure 5:
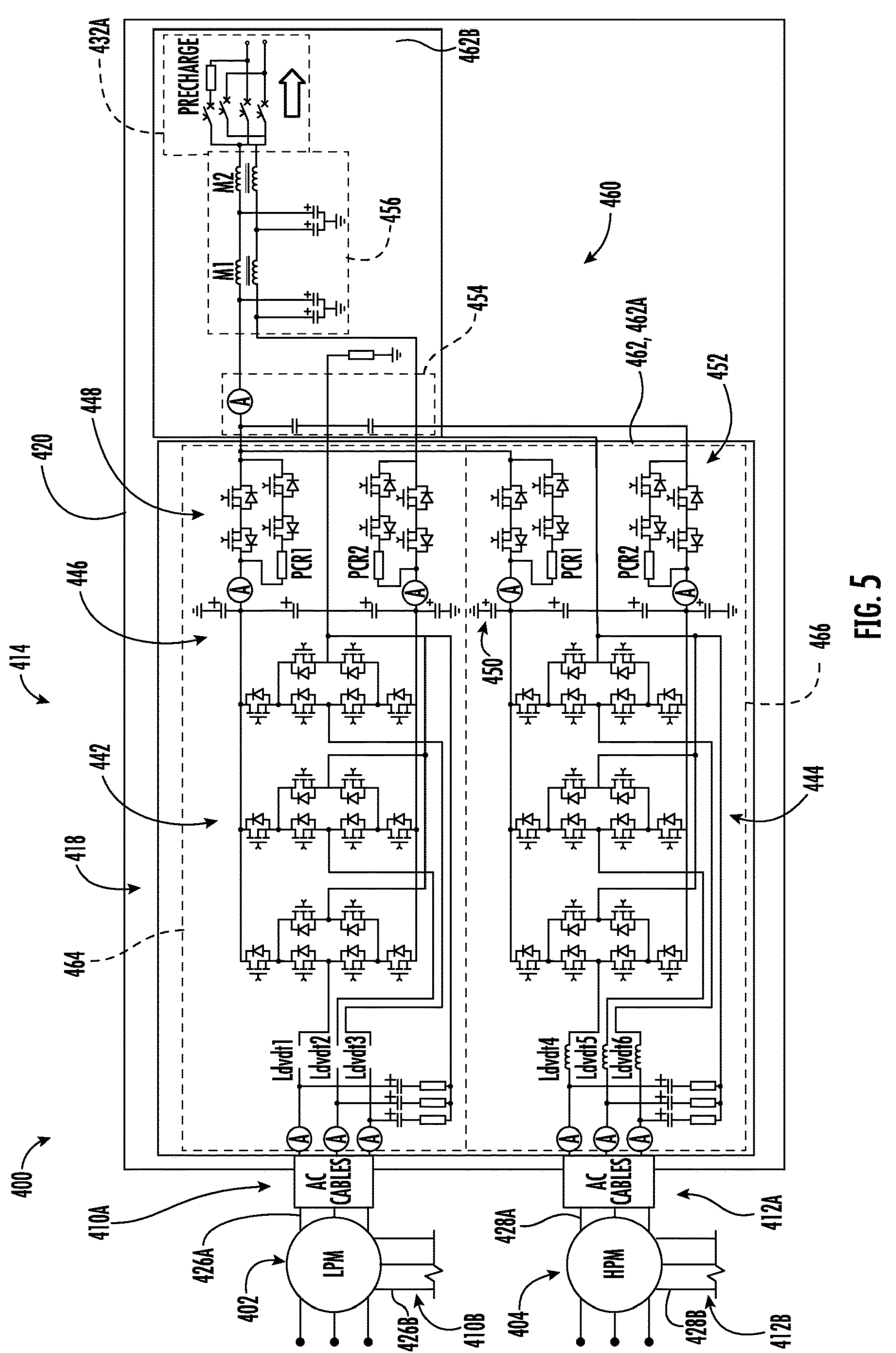
FIG. 5 is a more detailed schematic view of the exemplary first converter box of the exemplary aeronautical power system of FIG. 4.

Referring now to FIGS. 4 and 5, a more detailed explanation of the first converter box 414 of the exemplary aeronautical power system 400 described above with reference to FIG. 3 is provided. FIG. 4 provides a simplified schematic view of the first converter box 414 of the aeronautical power system 400 of FIG. 3, and FIG. 5 provides a more detailed schematic view of the first converter box 414 of the aeronautical power system 400 of FIG. 3.

As will be appreciated from the views of FIGS. 4 and 5, the first converter box 414 includes the first converter assembly 418, with the first converter assembly 418 including a plurality of AC/DC converters. It will be appreciated, that as used herein, the term "AC/DC converter" refers to a device that converts alternating current (AC) electric power from a power source into direct current (DC) electric power to be used by a power sink, and/or converts DC electric power from a power source to AC electric power to be used by a power sink. The AC/DC converter typically employs various electronic components, such as diodes, capacitors, and inductors, to facilitate the transformation.

More specifically, the first converter assembly 418 includes an EM1 first channel AC/DC converter 442 and an EM2 first channel AC/DC converter 444. The EM1 first channel AC/DC converter 442 is in electric connection with the first electric machine 402 through the EM1 first channel AC power cables 426A. The EM2 first channel AC/DC converter 444 is in electric connection with the second electric machine 404 through the EM2 first channel AC power cables 428A. Sometimes filter components (not shown) using resistors, capacitors and inductors may be used to connect the AC power cables to the AC/DC converters.

Further, the exemplary aeronautical power system 400 also includes an EM1 first channel local capacitor bank 446 and an EM1 first channel isolator 448, each in series electric connection with the EM1 first channel AC/DC converter 442. Notably, the EM1 first channel local capacitor bank 446 is positioned at a location between the EM1 first channel AC/DC converter 442 and the EM1 first channel isolator 448 in the series electric connection.

Similarly, the aeronautical power system 400 further includes an EM2 first channel local capacitor bank 450 and an EM2 first channel isolator 452, each in series electric connection with the EM2 first channel AC/DC converter 444. The EM2 first channel local capacitor bank 450 is positioned at a location between the EM2 first channel AC/DC converter 444 and the EM2 first channel isolator 452 in the series electric connection.

Referring still to FIGS. 4 and 5, the aeronautical power system 400 further includes a common capacitor bank 454 and an EMI filter 456. For the embodiment depicted, the common capacitor bank 454 in the EMI filter 456 are arranged in series electric connection and are each housed within the first converter box 414.

The EM1 first channel AC/DC converter 442 and the EM2 first channel AC/DC converter 444 are each in electrical connection with the common capacitor bank 454, and further are each in electrical connection with the EMI filter 456 (through the common capacitor bank 454). Notably, the EM1 first channel isolator 448 is in electric connection with the EM1 first channel AC/DC converter 442 and the common capacitor bank 454 at a location between the EM1 first channel AC/DC converter 442 and the common capacitor bank 454, and similarly the EM2 first channel isolator 452 is in electric connection with the EM2 first channel AC/DC converter 444 and the common capacitor bank 454 at a location between the EM2 first channel AC/DC converter 444 and the common capacitor bank 454. The EM1 first channel isolator 448 and the EM2 first channel isolator 452 may each be moved between a connected configuration (allowing for electrical flows thereacross) and a disconnected configuration (preventing electrical flows thereacross).

In such a manner, it will be appreciated that the exemplary configuration depicted in FIGS. 4 and 5 may allow for isolation of a fault within the first electric machine 402, the second electric machine 404, or both, while still allowing for an electric power output from the aeronautical power system 400.

For example, in the event of a failure in the EM1 first channel 410A of the first electric machine 402, the EM1 first channel isolator 448 may electrically disconnect the EM1 first channel 410A, the EM1 first channel AC/DC converter 442, and the EM1 first channel local capacitor bank 446 from the common capacitor bank 454 and other downstream electrical components (or upstream electrical components in the event the first electric machine is being operated as a motor).

As will be appreciated, with such configuration the common capacitor bank 454 need not be capable of accommodating electric power from the EM1 first channel 410A of the first electric machine 402 during such a fault condition, which may be at a higher voltage than during normal operating conditions. For example, during a fault condition, a higher voltage may be generated as a result of back EMF, e.g., as there is no field weakening by the converter. With such a configuration, during a fault condition when the EM1 first channel isolator 448 electrically disconnects the EM1 first channel 410A of the first electric machine 402 from the downstream electric components within the first converter box 414, the EM1 first channel local capacitor bank 446 may be utilized to accommodate the higher voltage generated by the EM1 first channel 410A of the first electric machine 402.

Such a configuration may allow for the capacitors of the common capacitor bank 454 to define an electrical voltage rating less than the capacitors of the EM1 first channel local capacitor bank 446 and an electrical capacitance rating higher than the capacitors local capacitor bank 446. In particular, as will be appreciated particularly from the embodiment of FIG. 5, the EM1 first channel local capacitor bank 446 defines an electrical voltage rating higher than an electrical voltage rating of the common capacitor bank 454. In addition, the capacitance of the local capacitors 446 and 450 are much less than the capacitance of common capacitor bank 454.

Similarly, the EM2 first channel local capacitor bank 450 defines an electrical voltage rating higher than the electrical capacitance rating of the common capacitor bank 454, as the EM2 first channel local capacitor bank 450 may similarly be configured to accommodate higher than normal voltages from the EM2 first channel 412A during a fault condition in the second electric machine 404. The capacitance of the local capacitor bank 450 is less than the capacitance f the common capacitor bank 454.

Such a configuration may result in a lighter, less voltage rated, and simpler common capacitor bank 454 utilized with the electric power from the EM1 first channel 410A and the electric power from the EM2 first channel 412A.

Further, in at least certain exemplary embodiments, the first electric machine 402 may define a first power rating (e.g., a maximum amount of power the electric machine is rated to generate) and the second electric machine 404 may define a second power rating. In at least certain exemplary embodiments, the second power rating of the second electric machine 404 may be different than the first power rating of the first electric machine 402. Nonetheless, the exemplary configuration of the electrical components depicted within the first converter box 414 in FIGS. 4 and 5 may allow for the electric power from the first electric machine 402 and the electric power from the second electric machine 404 to be combined to generate a single electrical power output provided to the first section 432A of the PDMU 430 through the first single DC power link 436A.

Such a configuration may provide thermal management benefits, as a maximum power output of electrical components within the first converter box 414 may be less than if the AC/DC converters for the higher power electric machine were each contained within a single converter box.

Moreover, it will be appreciated that although not depicted, the second converter box 416 having the second converter assembly 422 (see FIG. 3) may be configured in substantially the same manner as the first converter box 414 having the first converter assembly 418. For example, although not depicted, the second converter assembly 422 of the second converter box 416 may include an EM1 second channel AC/DC converter (in electric connection with the EM1 second channel 410B of the first electric machine 402) and an EM2 second channel AC/DC converter (in electric connection with the EM2 second channel 412B of the second electric machine 404). The aeronautical power system 400 may further include power electronics similar to the power electronics of FIGS. 4 and 5 downstream of the AC/DC converters, and upstream of the second section 432B of the PDMU 430 (see FIG. 3).

Referring now particularly to FIG. 5, as briefly noted above, the aeronautical power system 400 includes structure to provide redundancy from a thermal management standpoint. In particular, the first converter box 414 includes a first cold plate assembly 460, the first cold plate assembly 460 including one or more cold plates 462. In particular, for the embodiment depicted, the EM1 first channel AC/DC converter 442 and the EM2 first channel AC/DC converter 444 are each in thermal communication with the one or more cold plates 462 of the first cold plate assembly 460. More specifically, still, for the embodiment depicted, the common capacitor bank 454, the EMI filter 456, and the first section 432A of the PDMU 430 are all also in thermal communication with the one or more cold plates 462 of the first cold plate assembly 460.

As is depicted schematically in FIG. 5, the one or more cold plates 462 includes a first cold plate 462A and a second cold plate 462B. The first cold plate 462A notably includes a first side 464 and a second side 466, indicated schematically by the dotted lines at reference number 464, 466 in FIG. 5. The EM1 first channel AC/DC converter 442 is positioned on and in thermal communication with the first side of the first cold plate 462A, the EM2 first channel AC/DC converter 444 is positioned on and in thermal communication with the second side of the first cold plate 462A, and the common capacitor bank 454, the EMI filter 456, and the first section 432A of the PDMU 430 are positioned on and in thermal communication with the second cold plate 462B.

Figure 6:
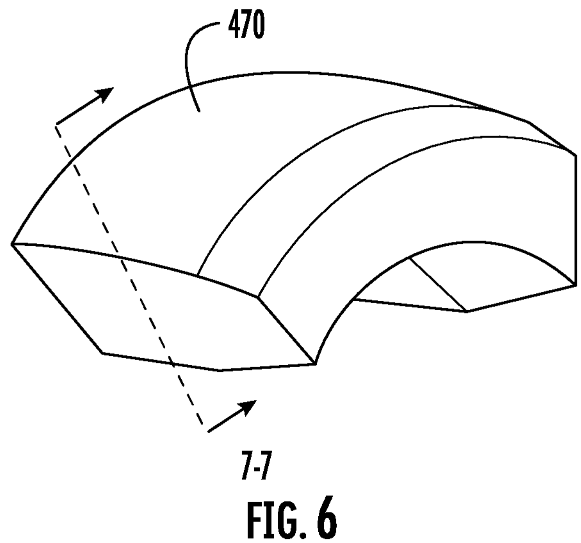
FIG. 6 is a perspective view of a volume within an engine that may house an aeronautical power system in accordance with an exemplary aspect of the present disclosure.
Figure 7:
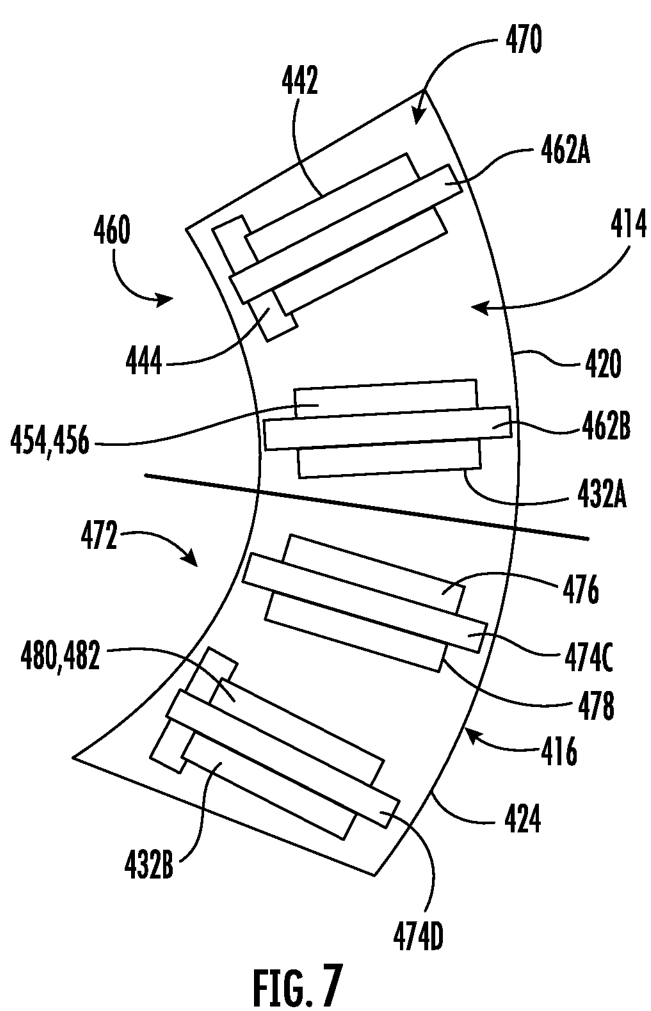
FIG. 7 is a schematic, cross-sectional view of the exemplary aeronautical power system of FIG. 6.

For example, referring briefly to FIG. 6, a perspective view is provided of a volume 470 within which the first converter box 414 and the second converter box 416 may be housed within the engine (see FIG. 2). FIG. 7 provides a schematic, cross-sectional view of the volume 470 of FIG. 6, along Line 7-7 of FIG. 6.

In the view of FIG. 7, the first converter box 414 and the second converter box 416 are positioned adjacent to one another within the volume 470. The first converter box 414 includes the first cold plate 462A and the second cold plate 462B, with the components noted above coupled to the respective cold plates 462.

As will be appreciated, the aeronautical power system 400 further includes a second cold plate assembly 472, with the second cold plate assembly 472 having one or more cold plates 474. In particular, for the embodiment depicted, the second cold plate assembly 472 includes a third cold plate 474C and a fourth cold plate 474D. The third and fourth cold plates 474C, 474D are positioned within the second converter box 416 with the various power electronics of the aeronautical power system 400 housed within the second converter box 416. For example, in the embodiment depicted, an EM1 second channel AC/DC converter 476 is positioned on and in thermal communication with a first side of the third cold plate 474C, an EM2 second channel AC/DC converter 478 is positioned on and in thermal communication with a second side of the third cold plate 474C, and a common capacitor bank 480, an EMI filter 482, and the second section 432B of the PDMU 430 are positioned on and in thermal communication with the fourth cold plate 474D.

Figure 8:
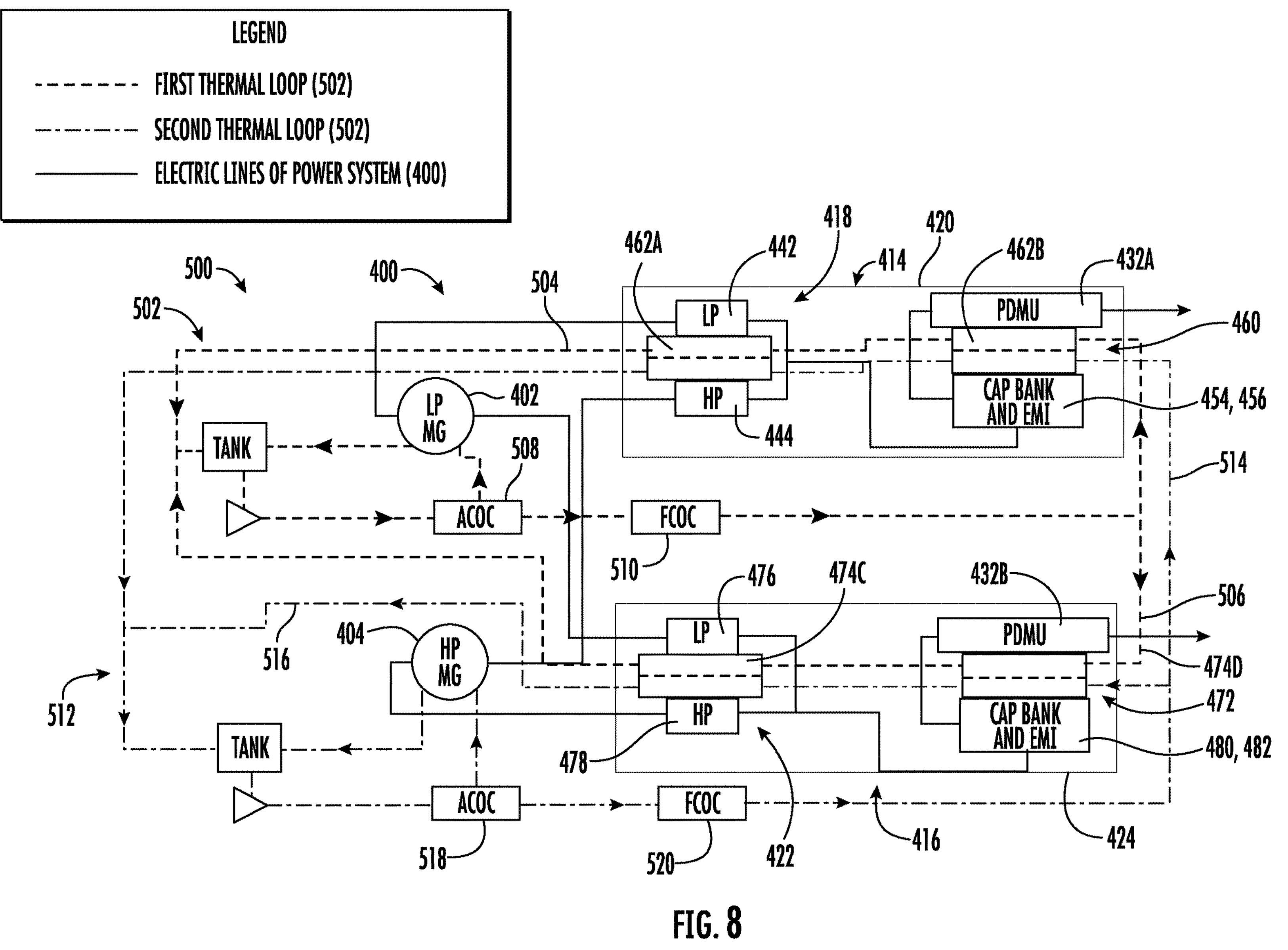
FIG. 8 is a schematic diagram of a thermal management system in accordance with an exemplary aspect of the present disclosure.

Referring now to FIG. 8, a schematic view of a thermal management system 500 operable with an aeronautical power system 400 in accordance with one or more exemplary aspects of the present disclosure is provided. For example, the aeronautical power system 400 depicted schematically in FIG. 8 may be configured in substantially the same manner as the exemplary aeronautical power system 400 described above with reference to FIGS. 3 through 7, and the same or similar numbers may refer to the same or similar parts.

For example, the aeronautical power system 400 includes a first electric machine 402 and a first converter box 414 having a first converter assembly 418. The first converter assembly 418 includes a EM1 first channel AC/DC converter 442 in electric connection with a first channel of the first electric machine 402 and an EM2 first channel AC/DC converter 444 in electric connection with a first channel of the second electric machine 404. The aeronautical power system 400 further includes a common capacitor bank 454 and an EMI filter 456 housed within the first converter box 414, as well as a first section 432A of a PDMU 430 housed within the first converter box 414 (i.e., positioned within a housing 420 of the first converter box 414). The EM1 first channel AC/DC converter 442 and the EM2 first channel AC/DC converter 444 are each coupled to a first cold plate 462A within the first converter box 414, and the common capacitor bank 454, the EMI filter 456, and the first section 432A of the PDMU 430 are coupled to a second cold plate 462B within the first converter box 414.

The aeronautical power system 400 further includes a second electric machine 404 and a second converter box 416 having a second converter assembly 422. The second converter assembly 422 includes an EM1 second channel AC/DC converter 476 in electric connection with a second channel of the first electric machine 402 and an EM2 second channel AC/DC converter 478 in electric connection with a second channel of the second electric machine 404. The aeronautical power system 400 further includes a common capacitor bank 480 and an EMI filter 482 housed within the second converter box 416, as well as a second section 432B of the PDMU 430 housed within the second converter box 416 (i.e., positioned within a housing 424 of the second converter box 416). The EM1 second channel AC/DC converter 476 and the EM2 second channel AC/DC converter 478 are each coupled to a third cold plate 474C within the second converter box 416, and the common capacitor bank 480, the EMI filter 482, and the second section 432B of the PDMU 430 are each coupled to a fourth cold plate 474D within the second converter box 416.

The exemplary thermal management system 500 generally includes a first thermal loop 502 driven by the first electric machine 402 (or more particularly by a pump in fluid communication with the first thermal loop 502 powered by the first electric machine 402) and in thermal communication with both the first cold plate assembly 460 and the second cold plate assembly 472. More specifically, the first thermal loop includes a first section 504 in thermal communication with the first cold plate assembly 460 (the first cold plate 462A and the second cold plate 462B in the embodiment depicted) and a second section 506 in thermal communication with the second cold plate assembly 472 (the third cold plate 474C and the fourth cold plate 474D in the embodiment depicted). The first section 504 and the second section 506 are arranged in a parallel flow arrangement. Notably, the first cold plate 462A and the second cold plate 462B may act as heat sources for the first section 504 of the first thermal loop 502, and the third cold plate 474C and the fourth cold plate 474D may act as heat sources for the second section 506 of the first thermal loop 502. The first thermal loop 502 further includes a plurality of shared heat sink heat exchangers. In particular, for the embodiment depicted, the plurality of heat sink heat exchangers includes an air cooled oil cooler 508 and a fuel cooled oil cooler 510, etc.

The exemplary thermal management system 500 further includes a second thermal loop 512 configured in substantially the same manner as the first thermal loop 502. For example, the second thermal loop 512 is driven by the second electric machine 404 (or more particularly by a pump in fluid communication with the second thermal loop 512 powered by the second electric machine 404) and in thermal communication with both the first cold plate assembly 460 and the second cold plate assembly 472. More specifically, the second thermal loop 512 includes a first section 514 in thermal communication with the first cold plate assembly 460 (the first cold plate 462A and the second cold plate 462B in the embodiment depicted) and a second section 516 in thermal communication with the second cold plate assembly 472 (the third cold plate 474C and the fourth cold plate 474D in the embodiment depicted). The first section 514 and the second section 516 are arranged in a parallel flow arrangement. Notably, the first cold plate 462A and the second cold plate 462B may act as heat sources for the first section 514 of the second thermal loop 512, and the third cold plate 474C and the fourth cold plate 474D may act as heat sources for the second section 516 of the second thermal loop 512. The second thermal loop 512 further includes a plurality of shared heat sink heat exchangers. In particular, for the embodiment depicted, the plurality of heat sink heat exchangers includes an air cooled oil cooler 518 and a fuel cooled oil cooler 520, etc. By having the dual cooling loops driven by both the machines 402 and 404, to cool both the converter boxes 414 and 416, an overall reliability of the system for potential failures in one or both of the electric machines or associated pumps is high as compared to a single cooling loop driven by a single electric machine.

It will be appreciated that although the description above and FIGS. discussed above generally show two electric machines, each with at least two channels, in other exemplary embodiments, aspects of the present disclosure may apply to an aeronautical power system having two electric machine, where at least one only includes a single channel. In such a configuration, the aeronautical power system may or may not include a second converter box.

Figure 9:
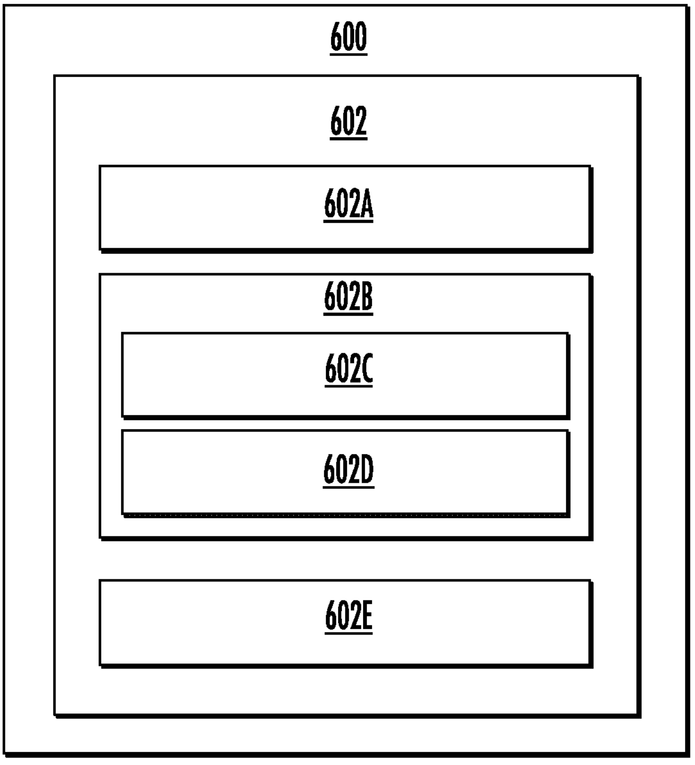
FIG. 9 provides an example computing system according to example embodiments of the present disclosure.

FIG. 9 provides an example computing system 600 according to example embodiments of the present disclosure. The computing devices or elements described herein, such as PDMU 430, may include various components and perform various functions of the computing system 600 described below, for example.

As shown in FIG. 9, the computing system 600 can include one or more computing device(s) 602. The computing device(s) 602 can include one or more processor(s) 602A and one or more memory device(s) 602B. The one or more processor(s) 602A can include any suitable processing device, such as a microprocessor, microcontroller, integrated circuit, logic device, and/or other suitable processing device. The one or more memory device(s) 602B can include one or more computer-executable or computer-readable media, including, but not limited to, non-transitory computer-readable media, RAM, ROM, hard drives, flash drives, and/or other memory devices.

The one or more memory device(s) 602B can store information accessible by the one or more processor(s) 602A, including computer-readable instructions 602C that can be executed by the one or more processor(s) 602A. The instructions 602C can be any set of instructions that when executed by the one or more processor(s) 602A, cause the one or more processor(s) 602A to perform operations. In some embodiments, the instructions 602C can be executed by the one or more processor(s) 602A to cause the one or more processor(s) 602A to perform operations, such as any of the operations and functions for which the computing system 600 and/or the computing device(s) 602 are configured, such as controlling operation of electrical power systems. The instructions 602C can be software written in any suitable programming language or can be implemented in hardware. Additionally, and/or alternatively, the instructions 602C can be executed in logically and/or virtually separate threads on processor(s) 602A. The memory device (s) 602B can further store data 602D that can be accessed by the processor(s) 602A. For example, the data 602D can include models, lookup tables, databases, etc.

The computing device(s) 602 can also include a network interface 602E used to communicate, for example, with the other components of system 600 (e.g., via a communication network). The network interface 602E can include any suitable components for interfacing with one or more network(s), including for example, transmitters, receivers, ports, controllers, antennas, and/or other suitable components. One or more devices can be configured to receive one or more commands from the computing device(s) 602 or provide one or more commands to the computing device(s) 602.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Further aspects are provided by the subject matter of the following clauses:

An aeronautical power system comprising: a first electric machine comprising an EM1 channel; a second electric machine comprising an EM2 channel; a first converter box in electric connection with the EM1 channel and the EM2 channel.

The aeronautical power system of any preceding clause, wherein the first electric machine has a first power rating, and wherein the second electric machine has a second power rating that is different from the first power rating.

The aeronautical power system of any preceding clause, wherein the first electric machine is a low pressure spool electric machine configured to rotate with a low pressure spool of an engine when the aeronautical power system is integrated with the engine, and wherein the second electric machine is a high pressure spool electric machine configured to rotate with a high pressure spool of the engine when the aeronautical power system is integrated with the engine.

The aeronautical power system of any preceding clause, wherein the first converter box includes an EM1 channel AC/DC converter and an EM2 channel AC/DC converter.

The aeronautical power system of any preceding clause, further comprising: a common capacitor bank, wherein the EM1 channel AC/DC converter and the EM2 channel AC/DC converter are each in electrical connection with the common capacitor bank.

The aeronautical power system of any preceding clause, further comprising: an EM1 first channel isolator in electrical connection with the EM1 channel AC/DC converter and the common capacitor bank at a location between the EM1 channel AC/DC converter and the common capacitor bank.

The aeronautical power system of any preceding clause, further comprising: an EM1 channel local capacitor bank in electrical connection with the EM1 channel AC/DC converter and the EM1 channel isolator at a location between the EM1 channel AC/DC converter and the EM1 channel isolator.

The aeronautical power system of any preceding clause, wherein the EM1 channel local capacitor bank defines an electrical capacitance rating lower than a capacitance rating of the common capacitor bank.

The aeronautical power system of any preceding clause, further comprising: an EM2 channel isolator in electrical connection with the EM2 channel AC/DC converter and the common capacitor bank at a location between the EM2 channel AC/DC converter and the common capacitor bank.

The aeronautical power system of any preceding clause, wherein the common capacitor bank is housed within the first converter box.

The aeronautical power system of any preceding clause, further comprising: a PDMU, wherein the EM1 channel AC/DC converter and the EM2 channel AC/DC converter are in electrical connection with the PDMU through a single DC power link.

The aeronautical power system of any preceding clause, further comprising: an EMI filter, wherein the EM1 channel AC/DC converter and the EM2 channel AC/DC converter are in electrical connection with the EMI filter.

The aeronautical power system of any preceding clause, wherein the EM1 filter is housed in the first converter box.

The aeronautical power system of any preceding clause, further comprising: a common capacitor bank, wherein the EMI filter is in electrical connection with the EM1 channel AC/DC converter and the EM2 channel AC/DC converter through the common capacitor bank.

The aeronautical power system of any preceding clause, wherein the PDMU includes a first section and a second section, wherein the first section of the PDMU is housed in the first converter box.

The aeronautical power system of any preceding clause, wherein the first section of the PDMU comprises a plurality of breakers and/or switches and a plurality of electric power distribution lines, wherein each of the plurality of electric power distribution lines extends from a respective one of the plurality of breakers and/or switches.

The aeronautical power system of any preceding clause, wherein the first converter box comprises a first cold plate assembly, and wherein the aeronautical power system further comprises: a first thermal loop driven by the first electric machine and in thermal communication with both the first cold plate assembly; a second thermal loop also in thermal communication with the first cold plate assembly.

The aeronautical power system of any preceding clause, wherein the EM1 channel is an EM1 first channel and the first electric machine further comprises an EM1 second channel, wherein the EM2 channel is an EM2 first channel and the second electric machine further comprises an EM2 second channel, and wherein the aeronautical power system further comprises: a second converter box in electric connection with the EM1 second channel and the EM2 second channel.

The aeronautical power system of any preceding clause, wherein the first converter box comprises a first cold plate assembly, and wherein the second converter box comprises a second cold plate assembly.

The aeronautical power system of any preceding clause, further comprising: a first thermal loop driven by the first electric machine and in thermal communication with both the first cold plate assembly and the second cold plate assembly; and a second thermal loop driven by the second electric machine and also in thermal communication with both the first cold plate assembly and the second cold plate assembly.

The aeronautical power system of any preceding clause, wherein the first cold plate assembly comprises one or more cold plates, wherein the first converter box includes an EM1 first channel AC/DC converter and an EM2 first channel AC/DC converter, and wherein the EM1 first channel AC/DC converter and the EM2 first channel AC/DC converter are each in thermal communication with the one or more cold plates of the first cold plate assembly.

The aeronautical power system of any preceding clause, further comprising: a common capacitor bank; an EMI filter, wherein the EMI filter is in electrical connection with the EM1 first channel AC/DC converter and the EM2 first channel AC/DC converter through the common capacitor bank; and a PDMU having a first section, wherein the common capacitor bank, the EMI filter, and the first section of the PDMU are all in thermal communication with the one or more cold plates of the first cold plate assembly.

A hybrid-electric propulsion system comprising: a turbomachine comprising a first rotatable shaft and a second rotatable shaft; and an aeronautical power system comprising: a first electric machine comprising an EM1 channel, the first electric machine rotatable with the first rotating shaft of the turbomachine; a second electric machine comprising an EM2 channel, the second electric machine rotatable with the second rotating shaft of the turbomachine; a first converter box in electric connection with the EM1 channel and the EM2 channel.

An aeronautical power system comprising: a first electric machine comprising an EM1 channel; a second electric machine comprising an EM2 channel; a first converter assembly in electric connection with the EM1 channel and the EM2 channel; and a PDMU having a first section, wherein the first section is in electrical connection with the first converter assembly through a single DC power link.

The aeronautical power system of any preceding clause, further comprising: a first converter box housing the first converter assembly and the first section.

The aeronautical power system of any preceding clause, further comprising: a second converter assembly in electric connection with the EM1 second channel and the EM2 second channel, wherein the PDMU further includes a second section, wherein the single DC power link is a first single DC power link, and wherein the second section is in electrical connection with the second converter assembly through a second single DC power link.

The aeronautical power system of any preceding clause, wherein the first converter assembly comprises an EM1 channel AC/DC converter and an EM2 channel AC/DC converter.

This written description uses examples to disclose the present disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

We claim:

1. An aeronautical power system comprising:
- a first electric machine comprising an EM1 channel;
- a second electric machine comprising an EM2 channel;
- a first converter box in electric connection with the EM1 channel and the EM2 channel, wherein the first converter box includes an EM1 channel AC/DC converter and an EM2 channel AC/DC converter;
- a common capacitor bank; and
- an EMI filter arranged in series with the common capacitor bank, wherein the EM1 channel AC/DC converter and the EM2 channel AC/DC converter are each in electrical connection with EMI filter through the common capacitor bank.

2. The aeronautical power system of claim 1, wherein the first electric machine has a first power rating, and wherein the second electric machine has a second power rating that is different from the first power rating.

3. The aeronautical power system of claim 1, wherein the first electric machine is a low pressure spool electric machine configured to rotate with a low pressure spool of an engine when the aeronautical power system is integrated with the engine, and wherein the second electric machine is a high pressure spool electric machine configured to rotate with a high pressure spool of the engine when the aeronautical power system is integrated with the engine.

4. The aeronautical power system of claim 1, further comprising:
- an EM1 first channel isolator in electrical connection with the EM1 channel AC/DC converter and the common capacitor bank at a location between the EM1 channel AC/DC converter and the common capacitor bank.

5. The aeronautical power system of claim 4, further comprising:
- an EM1 channel local capacitor bank in electrical connection with the EM1 channel AC/DC converter and the EM1 first channel isolator at a location between the EM1 channel AC/DC converter and the EM1 first channel isolator.

6. The aeronautical power system of claim 5, wherein the EM1 channel local capacitor bank defines an electrical capacitance rating lower than a capacitance rating of the common capacitor bank.

7. The aeronautical power system of claim 1, further comprising:

an EM2 channel isolator in electrical connection with the EM2 channel AC/DC converter and the common capacitor bank at a location between the EM2 channel AC/DC converter and the common capacitor bank.

8. The aeronautical power system of claim 1, wherein the common capacitor bank is housed within the first converter box.

9. The aeronautical power system of claim 1, further comprising:

a PDMU, wherein the EM1 channel AC/DC converter and the EM2 channel AC/DC converter are in electrical connection with the PDMU through a single DC power link.

10. The aeronautical power system of claim 9, wherein the PDMU includes a first section and a second section, wherein the first section of the PDMU is housed in the first converter box.

11. The aeronautical power system of claim 1, wherein the EMI filter is housed in the first converter box.

12. The aeronautical power system of claim 1, wherein the EM1 channel is an EM1 first channel and the first electric machine further comprises an EM1 second channel, wherein the EM2 channel is an EM2 first channel and the second electric machine further comprises an EM2 second channel, and wherein the aeronautical power system further comprises:

a second converter box in electric connection with the EM1 second channel and the EM2 second channel.

13. The aeronautical power system of claim 12, wherein the first converter box comprises a first cold plate assembly, and wherein the second converter box comprises a second cold plate assembly.

14. The aeronautical power system of claim 13, further comprising:

a first thermal loop driven by the first electric machine and in thermal communication with both the first cold plate assembly and the second cold plate assembly; and a second thermal loop driven by the second electric machine and also in thermal communication with both the first cold plate assembly and the second cold plate assembly.

15. A hybrid-electric propulsion system comprising:

a turbomachine comprising a first rotatable shaft and a second rotatable shaft; and an aeronautical power system comprising:

a first electric machine comprising an EM1 channel, the first electric machine rotatable with the first rotatable shaft of the turbomachine;

a second electric machine comprising an EM2 channel, the second electric machine rotatable with the second rotatable shaft of the turbomachine;

a first converter box in electric connection with the EM1 channel and the EM2 channel, wherein the first converter box includes an EM1 channel AC/DC converter and an EM2 channel AC/DC converter;

a common capacitor bank; and an EMI filter arranged in series with the common capacitor bank, wherein the EM1 channel AC/DC converter and the EM2 channel AC/DC converter are each in electrical connection with EMI filter through the common capacitor bank.

16. An aeronautical power system comprising:

a first electric machine comprising an EM1 channel;

a second electric machine comprising an EM2 channel;

a first converter assembly in electric connection with the EM1 channel and the EM2 channel, wherein the first converter assembly includes an EM1 channel AC/DC converter and an EM2 channel AC/DC converter;

a PDMU having a first section, wherein the first section is in electrical connection with the first converter assembly through a single DC power link;

a common capacitor bank; and an EMI filter arranged in series with the common capacitor bank, wherein the EM1 channel AC/DC converter and the EM2 channel AC/DC converter are each in electrical connection with EMI filter through the common capacitor bank.

* * * * *